US007068056B1

(12) United States Patent
Gibbs et al.

(10) Patent No.: US 7,068,056 B1
(45) Date of Patent: Jun. 27, 2006

(54) SYSTEM AND METHOD FOR THE PROBING OF A WAFER

(75) Inventors: Byron H. Gibbs, McKinney, TX (US); Phillip H. Ball, Richardson, TX (US); Adolphus E. McClanahan, Garland, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 11/184,216

(22) Filed: Jul. 18, 2005

(51) Int. Cl.
*G01R 31/02* (2006.01)

(52) U.S. Cl. ..................................... 324/754
(58) Field of Classification Search ............... None
See application file for complete search history.

(56) References Cited

U.S. PATENT DOCUMENTS

| 5,410,259 | A | * | 4/1995 | Fujihara et al. | 324/758 |
| 5,604,446 | A | * | 2/1997 | Sano | 324/758 |
| 6,469,537 | B1 | * | 10/2002 | Akram et al. | 324/765 |
| 6,762,612 | B1 | * | 7/2004 | Yu et al. | 324/757 |
| 6,774,651 | B1 | * | 8/2004 | Hembree | 324/758 |
| 6,784,678 | B1 | * | 8/2004 | Pietzschmann | 324/758 |
| 2005/0116729 | A1 | * | 6/2005 | Koester et al. | 324/754 |

* cited by examiner

*Primary Examiner*—Vinh Nguyen
*Assistant Examiner*—Richard Isla-Rodas
(74) *Attorney, Agent, or Firm*—Yingsheng Tung; Wade James Brady, III; Frederick J. Telecky, Jr.

(57) ABSTRACT

In one embodiment, a method for probing a wafer includes providing a plurality of pressure sensors on a surface of a probe card holding tray, positioning a probe card of a testhead relative to a prober supporting a wafer, engaging the probe card with the probe card holding tray, receiving a plurality of pressure signals from respective pressure sensors, and comparing the pressure signals to determine if the probe card is substantially parallel with the prober.

20 Claims, 2 Drawing Sheets

SYSTEM AND METHOD FOR THE PROBING OF A WAFER

TECHNICAL FIELD OF THE INVENTION

This invention relates in general to the testing of electronic components and, more particularly, to a system and method for the probing of a wafer.

BACKGROUND OF THE INVENTION

An array of die, which may include integrated circuits and their components, are formed on and/or within a wafer during various semiconductor fabrication processes. At various stages during fabrication, it may be desirable to perform testing on the die to read information, write information, or otherwise gather information about the die and/or the components of the die. During testing, the wafer may be loaded into a prober that operates to sequentially align each die on the wafer with the test equipment. The test equipment may include a testhead that is positioned and locked proximate the prober in an optimum testing position. This positioning and locking operation is known as "docking" the testhead to the prober. For example, where the test environment includes a mounted probe card, the testhead is to be docked into position such that one or more contact points of the die may be aligned with one or more contact points on the probe card.

Typical manipulating and docking systems do not compensate for stack up variances associated with component interchangeability within the testhead, probe card, and prober. Rather, they rely on stack up tolerance control to ensure that the plane formed by the probe card's contact points is parallel to the plane of the die's contact points. Achieving and maintaining parallelism of these two planes by stack up control alone is impractical for systems that use vacuum to attach the probe card to the testhead. Planarity in vacuum attach systems is particularly vulnerable to stack up errors since the probe card's contact reference plane is primarily influenced by the reference plane of the testhead, its interfacing components, the prober, and the physical characteristics of the probe card itself.

SUMMARY OF THE INVENTION

In one embodiment, a method for probing a wafer includes providing a plurality of pressure sensors on a surface of a probe card holding tray, positioning a probe card of a testhead relative to a prober supporting a wafer, engaging the probe card with the probe card holding tray, receiving a plurality of pressure signals from respective pressure sensors, and comparing the pressure signals to determine if the probe card is substantially parallel with the prober.

Depending on the specific features implemented, particular embodiments of the present invention may exhibit some, none or all of the following technical advantages. Various embodiments may be capable of determining whether components of a testing system are substantially parallel with components of a probing system by utilizing pressure sensors circumferentially spaced about the holding tray. Thus, contact between the test equipment and a wafer may be substantially improved and the information from the wafer more accurately obtained during the subsequent probing session. In addition, one embodiment may be capable of ensuring that the testhead remains substantially parallel with the prober throughout the entire probing session. Accordingly, the position of the testhead relative to the prober may be continuously or periodically monitored.

Other technical advantages are readily apparent to one skilled in the art from the following figures, descriptions, and claims.

BRIEF DESCRIPTION OF THE DRAWINGS

For a more complete understanding of the invention and the advantages thereof, reference is now made to the following description, taken in conjunction with the accompanying drawings, wherein like reference numerals represent like parts, in which.

DETAILED DESCRIPTION OF EXAMPLE EMBODIMENTS OF THE INVENTION

Figure 1:
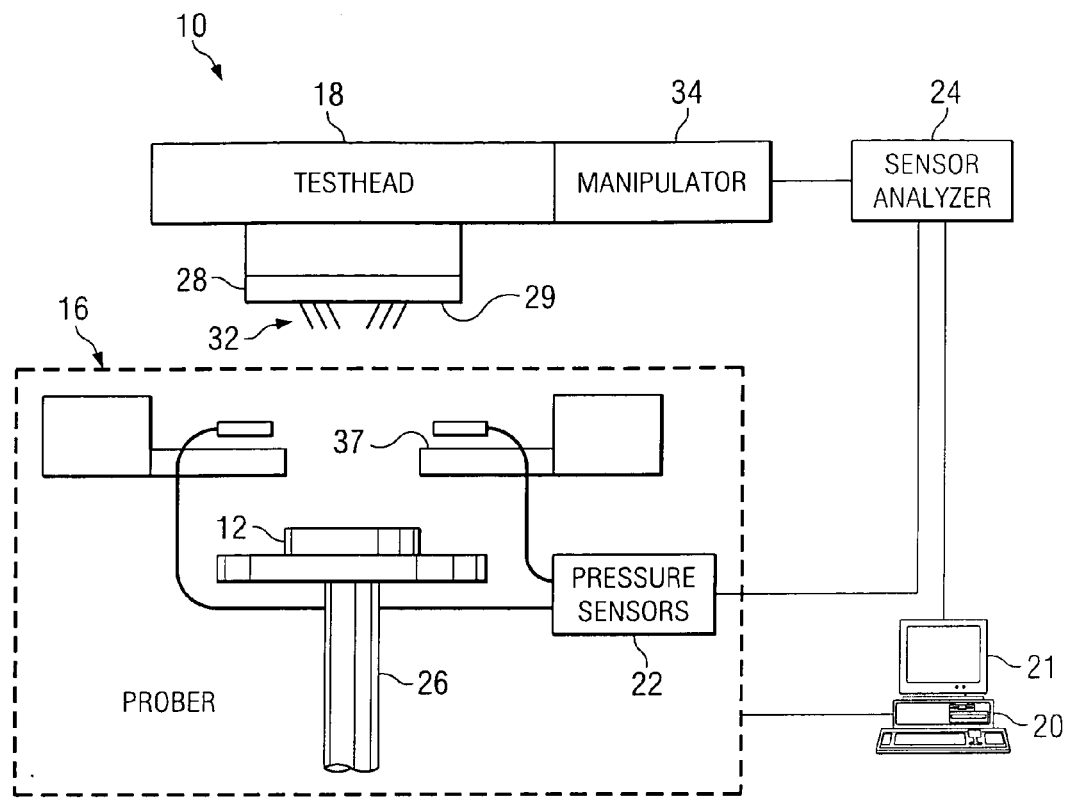
FIG. 1 is a schematic of a system for the probing of a wafer according to one embodiment of the invention.

FIG. 1 is a schematic of a system 10 for the probing of a wafer 12 according to one embodiment of the invention. Wafer 12 may include any suitable slice of crystal material sliced from a crystal cylinder grown for the purpose of semiconductor fabrication. In semiconductor fabrication, a wafer provides the foundation on which a semiconductor device may be created. The semiconductor device may be formed on the surface of the wafer using a variety of techniques, such as layering, photolithographic patterning, doping through implantation of ionic impurities, and heating. Wafer 12 may be formed from any suitable material, such as silicon, germanium, gallium arsenide, or other suitable substrate material.

In the illustrated embodiment, system 10 includes a prober 16, a testhead 18, a controller 20, and a sensor analyzer 24. In particular embodiments, the different components of system 10 cooperate to read data from, write data to, or otherwise gather information about each die associated with wafer 12. For the efficient and accurate performance of these functions, prober 16 includes a plurality of pressure sensors 22 for indicating the levelness of a probe card 28 of testhead 18 with respect to prober 16. Generally, sensor analyzer 24 receives pressure information from pressure sensors 22 and determines whether probe card 28 is in an optimum testing position relative to prober 16 and wafer 12.

Prober 16 includes a chuck 26 on which wafer 12 may be placed by a suitable transfer assembly (not shown). A vacuum or other suitable force may be applied to wafer 12 through chuck 26 to hold wafer 12 on chuck 26 while wafer 12 is in prober 16. In operation, chuck 26 includes a supportive structure that may be mechanically or robotically operated to move horizontally and vertically within prober 16 to position wafer 12 into a testing position such that data may be retrieved from or imported to wafer 12. More specifically, chuck 26 may be moved horizontally and vertically to sequentially position each die on wafer 12 into a testing position.

In the testing position, wafer 12 is positioned beneath probe card 28 that includes circuitry and components enabling probe card 28 to operate as an interface between wafer 12 and testhead 18. In the illustrated embodiment, probe card 28 is suspended from testhead 18 and, thus, forms a component associated with and manipulated by testhead 18. In other embodiments, however, probe card 28 may be associated with prober 16.

Regardless of whether probe card 28 is a component of testhead 18 or prober 16, wafer 12 may be positioned such that during the testing process a particular die on wafer 12 is aligned with or positioned proximate to probe card 28. In particular embodiments, one or more pins 32 may extend from the lower or bottom surface 29 of probe card 28. For example, pins 32 may extend from an edge of an aperture of probe card 28. In the testing position, each pin 32 contacts an associated pad or contact point on the particular die being tested. Accordingly, pins 32 of probe card 28 operate as an interface between probe card 28 and the particular die on wafer 12 undergoing testing. Although probe card 28 is described as comprising a substantially round component that includes an aperture configured through the probe card 28, the configuration of probe card 28 may be dependent upon the particular type of wafer 12 undergoing probing. As a result, it is generally recognized that probe card 28 may be of any appropriate size, shape, and configuration for providing an interface between each die associated with wafer 12 and the components of testhead 18.

Pins 32 allow testhead 18 to test each die supported on wafer 12. Thus, testhead 18 may be used to read data from, write data to, and/or otherwise gather information about each die on wafer 12. For example, testhead 18 may perform a functional test to determine whether each die is operating correctly. As discussed above, wafer 12 is in the proper testing position when pads or contact points on wafer 12 can be positioned to contact their respective pins 32 on the probe card 28 within the required limits.

Testhead 18 may include an electronically controlled and actuated manipulator 34. Manipulator 34 may include appropriate circuitry and software for allowing testhead 18 to be accurately manipulated with respect to at least three spatial axes for the alignment of testhead 18 to prober 16. In particular embodiments, manipulator 34 may include a docking system for positioning and locking testhead 18 to prober 16.

In an optimal testing position, testhead 18 is properly aligned with prober 16 when the lower surface 29 of probe card 28 is substantially parallel to a surface 37 of a probe card holding tray 35 of prober 16. For purposes of this document, substantially parallel includes deviations within a range determined and specified by user needs.

During a probing session, the parallelism of probe card 28 and probe card holding tray 35 may be periodically or continuously monitored. The parallelism of probe card 28 relative to probe card holding tray 35 may also be verified after a suspension of a probing session, after the interchanging or substitution of components within system 10, or after undocking and redocking testhead 18 to prober 16 as these events may result in the misalignment of probe card 28 relative to probe card holding tray 35. As is described in more detail below, where a misalignment of probe card 28 is detected, manipulator 34 and/or the docking system may be used to realign testhead 18 with respect to prober 16.

Controller 20 communicates with one or more components of system 10. In particular embodiments, controller 20 may control or drive the operations of prober 16 and/or testhead 18. Accordingly, controller 20 may include suitable software for generating and communicating commands to prober 16 and/or testhead 18. The commands communicated to prober 16 may direct prober 16 to begin a probing session, stop a probing session, or resume a probing session. In particular embodiments, controller 20 may generate these and other commands and communicate the commands directly or indirectly through other systems to prober 16 when a misalignment of probe card 28 relative to probe card holding tray 35 is detected. For example, controller 20 may direct prober 16 to cease a probing session when a misalignment of probe card 28 relative to probe card holding tray 35 is detected. Similarly, controller 20 may direct prober 16 to resume a probing session when the misalignment is remedied.

Controller 20 may also include a display 21 on which the position of testhead 18 and prober 16 may be communicated to a user. Using display 21, the parallelism of probe card 28 and probe card holding tray 35 relative to one another may be displayed to a user performing the test probing session.

Pressure sensors 22 are coupled to probe card holding tray 35 in any suitable manner. Pressure sensors 22 are operable to receive pressure signals that identify respective forces exerted by probe card 28 on prober 16. The pressure signals may identify the planar position of surface 29 of probe card 28 relative to surface 37 of probe card holding tray 35. Although any suitable pressure sensors may be utilized, in particular embodiments, pressure sensors include the Flexi-Force® A201 force sensors as manufactured by Tekscan, Inc. The FlexiForce® A201 force sensor is just one example, however, of pressure sensors that may be utilized. Any sensor for detecting or identifying the force exerted by probe card 28 on probe card holding tray 35 may be utilized.

The signals generated by each pressure sensor 22 may be communicated to sensor analyzer 24, which may be configured to receive and process the signals. In particular embodiments, the processing of the signals may include the conversion of the analog signals into digital signals. The digital signals may represent pressures detected by each pressure sensor 22. The pressures may then be compared to one another to obtain pressure differentials between any two pressure sensors 22 and compared to a pressure differential tolerance, which may be set prior to the probing session, to determine if probe card 28 is in proper alignment with probe card holding tray 35.

As discussed above, the alignment of testhead 18 is proper when surface 29 of probe card 28 is substantially parallel to surface 37 of probe card holding tray 35 of prober 16. In particular embodiments, testhead 18 may be in proper alignment when the composite plane created by contact points or pins 32 of probe card 28 is substantially parallel to the pads or contact points of wafer 12. Where the alignment of testhead 18 is determined to be improper, sensor analyzer 24 may communicate signals, commands, or other suitable information to manipulator 34 that results in the ceasing of the probing process or the adjustment of testhead 18 to place probe card 28 in the proper testing position. The provision of such signals, commands, or information from sensor analyzer 24 to manipulator 34 and/or the docking system may close a feedback loop. For the processing of conflicting or otherwise incompatible information, manipulator 34, the docking system, and/or sensor analyzer 24 may include circuitry suitable for stabilizing the feedback loop.

In particular embodiments, sensor analyzer 24 may communicate the signals, commands, or other information to display 21. Display 21 includes suitable circuitry to receive the signals, commands, or other information, convert the information into a displayable format, where appropriate, and display the information to a user. For example, display 21 may include a suitable display screen, such as an LCD screen or other visual display technologies to display the information to a user. The information may be noted, recorded, or otherwise archived by the user. In certain embodiments, the information may enable the user to perform rough or fine adjustments of testhead 18 by mechanically repositioning testhead 18. Alternatively, the user may issue one or more commands to manipulator 34 and/or the docking system of testhead 18 to cause the adjustment in position of testhead 18. The mechanical adjustment of testhead 18 by the user may be in addition to or in lieu of the adjustment of the testhead 18 by manipulator 34.

Although an example system 10 is illustrated and described, the configuration of system 10 is provided as one example of a system for the alignment of testing components for the probing of wafer 12. Accordingly, the present invention contemplates any configuration appropriate for the external driving and manipulation of probing and test equipment. Thus, system 10 may include fewer, more, or different components than those depicted in FIG. 1. For example, although system 10 is described as including controller 20 and sensor analyzer 24, it is recognized that the functionalities described for controller 20 and sensor analyzer 24 may be combined in a single component. Accordingly, either sensor analyzer 24, controller 20, or both may be omitted from system 10. Additionally, any of the described modules or components may be external to system 10 and the test equipment. Thus, where system 10 does not include controller 20 or sensor analyzer 24, a component external to the illustrated system 10 may perform the functionalities described above for controller 20 and sensor analyzer 24.

Figure 2:
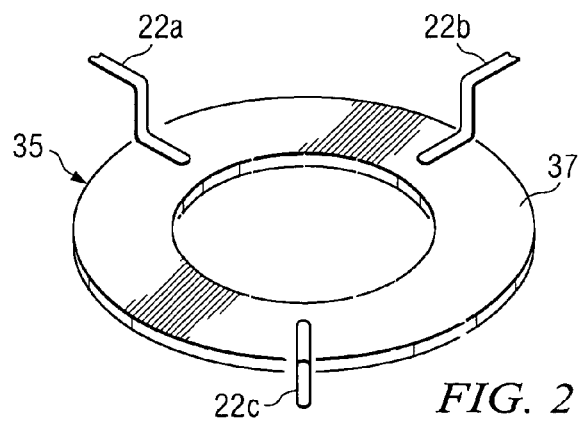
FIG. 2 is a perspective view of a plurality of pressure sensors on a surface of a probe card holding tray according to one embodiment of the invention.

FIG. 2 is a perspective view of pressure sensors 22 on surface 37 of probe card holding tray 35 according to one embodiment of the invention. Although any suitable number of pressure sensors 22 may be utilized, it is preferable that at least three pressure sensors 22 are utilized because three points define a plane. In the illustrated embodiment, three pressure sensors 22 are utilized and these pressure sensors 22 are circumferentially spaced about surface 37. In a more particular embodiment of the invention, pressure sensors 22 are equally circumferentially spaced about surface 37. In addition, pressure sensors 22 may be positioned, oriented, or otherwise located in any suitable manner on surface 37 of probe card holding tray 35. Pressure sensors 22 may also be electrically coupled to sensor analyzer 24 in any suitable manner in order to send pressure signals to sensor analyzer 24.

In operation of one embodiment of the invention, pressure sensors 22 are coupled to probe card holding tray 35 and electrically coupled to sensor analyzer 24. Testhead 18 is then positioned relative to prober 16 by manipulator 34. Probe card 28 is then engaged with probe card holding tray 35. Pressure sensors 22a, 22b, and 22c sense respective pressures exerted by probe card 28 on prober 16. Pressure signals indicative of the respective pressures are then sent to sensor analyzer 24 for analysis. Sensor analyzer 24 compares the pressures individually to particular limits and to one another to determine whether or not any of the individual pressures or pressure differentials between any two pressure sensors 22 are within a particular tolerances. If the tolerances are met, then probing may commence or continue. Wafer 12 is transferred to and placed on chuck 26 by a suitable transfer assembly (not shown). Chuck 26 may be moved horizontally, vertically, and in theta within prober 16 to position and align wafer 12 into a testing position. In preparation for testing, chuck 26 moves the wafer 12 horizontally and vertically to bring a die's contact pads into contact with pins 32 of probe card 28. If the tolerances are not met, then control signals may be sent to prober 16 and/or testhead 18 to prevent or cease the probing operation and then to manipulator 34 to adjust the positioning of testhead 18 in order to level probe card 28 relative to prober 16. Although any suitable pressure differential tolerance is contemplated by the present invention, in one embodiment, the maximum pressure differential tolerance between any two pressure sensors is between three to five pounds per square inch.

Figure 3:
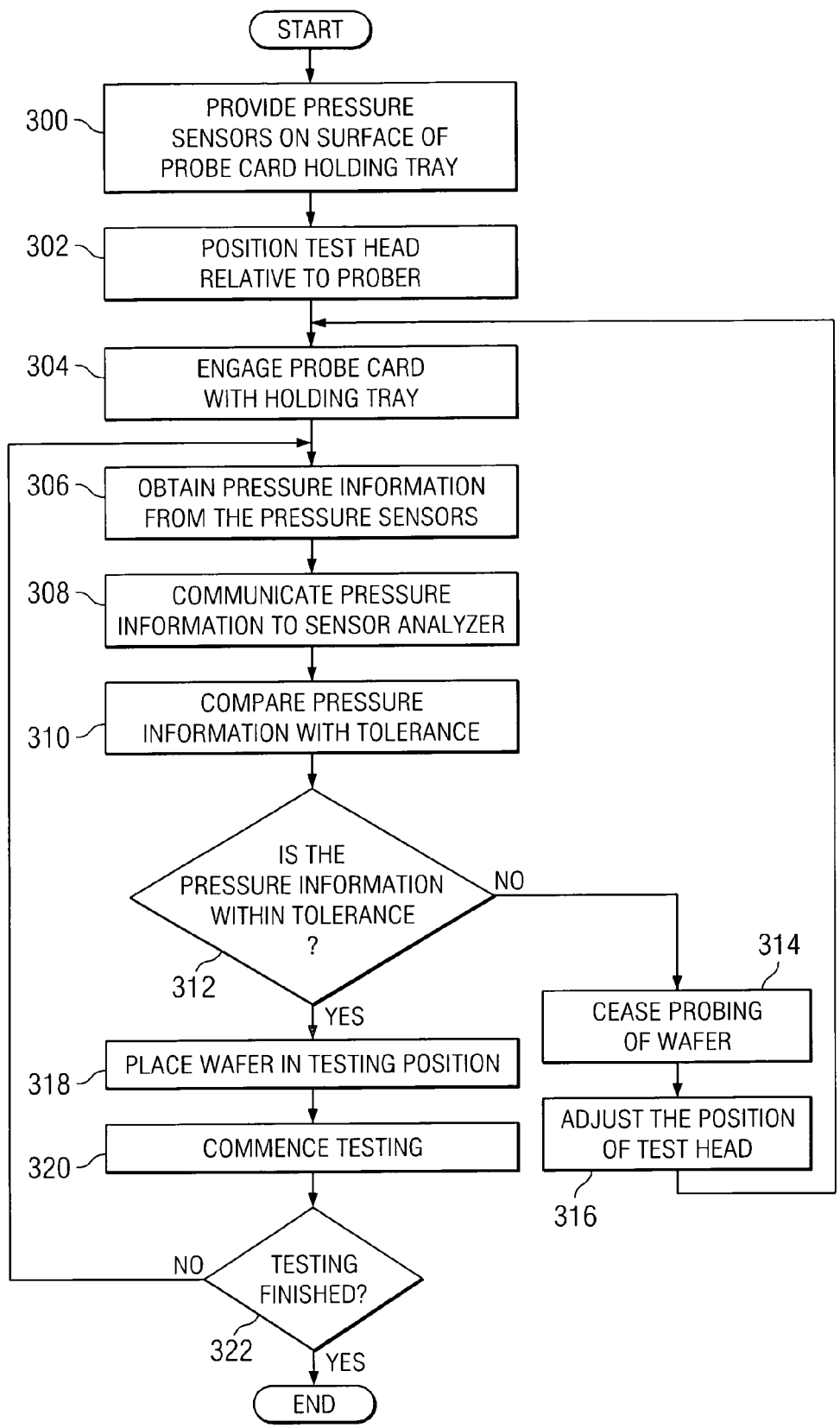
FIG. 3 is a flowchart of a method for the probing of a wafer according to one embodiment of the invention.

FIG. 3 is a flowchart of an example method for probing wafer 12 according to one embodiment of the invention. The method begins at step 300 where pressure sensors 22 are provided on surface 37 of probe card holding tray 35. Testhead 18 is positioned relative to prober 16 at step 302. More specifically, testhead 18 may be positioned so that probe card 28, which is suspended from testhead 18 or otherwise located between testhead 18 and prober 16, is substantially positioned to allow wafer 12, when loaded onto the chuck 26, to properly align with probe card 28. For example, testhead 18 may be positioned to allow alignment of a particular die on wafer 12 with one or more pins 32 extending from probe card 28.

At step 304, probe card 28 is engaged with probe card holding tray 35. Pressure information is obtained from pressure sensors 22, as indicated by step 306, and this pressure information is communicated to sensor analyzer 23 at step 308. At step 310, the pressure information is compared individually to predetermined pressure limits and to differential tolerances. The comparisons may be used by sensor analyzer 24 to determine whether testhead 18 is aligned with prober 16. Hence, at decisional step 312, it is determined whether or not the obtained pressure differentials are within the tolerance.

If the tolerance has been met by each of the pressure differentials, then the probing of wafer 12 may commence and/or continue and the example method continues at step 318 where wafer 12 is placed in a testing position. In particular embodiments, wafer 12 may be mechanically or robotically placed on chuck 26, as noted above, and a vacuum may be applied to wafer 12 through chuck 26 to hold wafer 12 on chuck 26. Chuck 26 may be mechanically or robotically moved to place wafer 12 in the testing position. Once wafer is in a testing position, testing of wafer 12 is commenced, as indicated by step 320. At decisional step 322, it is determined whether or not testing is finished. If testing is finished, then the example method ends. If testing is not finished, then the method continues at step 306 as noted above.

Referring back to decisional step 312, if the tolerance has not been met by any of the pressure differentials, then the probing of wafer 12 may be ceased, as indicated by step 314. Then, at step 316, the position of testhead 18 is adjusted in order to adjust the levelness of probe card 28 relative to prober 16. The method then continues at step 304 as noted above. Accordingly, the position of testhead 18 relative to prober 16 may be iteratively adjusted until the proper levelness is obtained.

In summary, a system and method for obtaining alignment of test equipment components for the probing of a wafer 12 is provided. The system and method include pressure sensors 22 that are associated with probe card holding tray 35. The sensors provide pressure information to sensor analyzer 34, which then operates to ensure the accurate and precise positioning of probe card 28 relative to prober 16 and wafer 12. In addition to improving the parallelism of probe card 28 relative to prober 16 prior to the initiation of a probing session, system 10 may further ensure that surface 29 of probe card 28 remains substantially parallel with surface 37 of prober 16 throughout the entire probing session. For example, the position of testhead 18 relative to prober 16 may be continuously or periodically monitored via pressure sensors 22 to quickly determine if testhead 18 becomes misaligned. As a result, contact between testhead 18 and wafer 12 may be substantially improved and the information from wafer 12 more accurately obtained during the probing session.

Although embodiments of the invention and their advantages are described in detail, a person skilled in the art could make various alterations, additions, and omissions without departing from the spirit and scope of the present invention, as defined by the appended claims.

What is claimed is:

1. A method for probing a wafer comprising:
providing a plurality of pressure sensors on a surface of a probe card holding tray;
positioning a probe card of a testhead relative to a prober supporting a wafer;
engaging the probe card with the probe card holding tray;
receiving a plurality of pressure signals from respective pressure sensors; and
comparing the pressure signals to determine if the probe card is substantially parallel with the prober.

2. The method of claim 1, further comprising adjusting the position of the probe card of the testhead in response to the comparison.

3. The method of claim 1, further comprising ceasing operation of the probing in response to the comparison.

4. The method of claim 1, wherein the pressure sensors are circumferentially spaced about the surface of the probe card holding tray.

5. The method of claim 4, wherein the pressure sensors are equally circumferentially spaced about the surface of the probe card holding tray.

6. The method of claim 4, wherein the plurality of pressure sensors comprise three pressure sensors equally circumferentially spaced about the surface of the probe card holding tray.

7. The method of claim 1, wherein the pressure sensors comprise thin film pressure sensors.

8. The method of claim 1, wherein comparing the pressure signals comprises comparing an individual pressure to a limit and comparing a pressure differential between any two pressure sensors to a pressure differential tolerance.

9. The system of claim 1, further comprising displaying a pressure differential indicator to a user in response to determining that the probe card is not substantially parallel with the prober.

10. A system for probing a wafer comprising:
a prober operable to support a wafer in a testing position;
a testhead positioned proximate the prober, the testhead comprising a manipulator operable to adjust the position of the testhead relative to the prober;
a plurality of pressure sensors circumferentially spaced about a probe card holding tray of the prober and operable to receive respective pressure signals identifying respective forces exerted by the testhead on the prober; and
a sensor analyzer operable to compare the pressure signals to determine if the probe card is substantially parallel with the prober.

11. The system of claim 10, wherein the sensor analyzer is further operable to:
receive a pressure differential tolerance; and
store the pressure differential tolerance.

12. The system of claim 11, wherein the sensor analyzer is further operable to provide an output signal to allow for adjustment of the position of the probe card when the pressure differential tolerance has not been met.

13. The system of claim 11, wherein the sensor analyzer is further operable to provide an output signal to allow for ceasing of the probing operation when the pressure differential tolerance has not been met.

14. The system of claim 10, wherein the sensor analyzer is further operable to display a pressure differential indicator to a user in response to determining that the testhead is not substantially parallel with the prober.

15. The system of claim 10, wherein the pressure sensors are equally circumferentially spaced about a surface of the probe card holding tray.

16. The system of claim 15, wherein the plurality of pressure sensors comprise three pressure sensors equally circumferentially spaced about the surface of the probe card holding tray.

17. The system of claim 10, wherein the pressure sensors comprise thin film pressure sensors.

18. A system for probing a wafer comprising:
means for providing a plurality of pressure sensors on a surface of a probe card holding tray;
means for positioning a probe card of a testhead relative to a prober supporting a wafer;
means for engaging the probe card with the probe card holding tray;
means for receiving a plurality of pressure signals from respective pressure sensors; and
means for comparing the pressure signals to determine if the probe card is substantially parallel with the prober.

19. The system of claim 18, further comprising means for adjusting the position of the probe card of the testhead in response to the comparison.

20. The system of claim 18, further comprising means for ceasing operation of the probing in response to the comparison.

* * * * *